United States Patent
Elsinger et al.

[11] Patent Number: 5,912,435
[45] Date of Patent: Jun. 15, 1999

[54] CIRCUIT ARRANGEMENT HAVING A PLURALITY OF CIRCUIT UNITS AND A COMMON MULTI-WIRE CABLE

[75] Inventors: Herbert Elsinger, Holzkirchen; Johannes Oberndorfer, Miesbach; Friedrich Plappert, Holzkirchen, all of Germany; Shigeru Tajima, Osaka, Japan

[73] Assignee: Euro-Matsushita Electric Works Aktiengesellschaft, Holzkirchen, Germany

[21] Appl. No.: 08/766,648

[22] Filed: Dec. 13, 1996

[30] Foreign Application Priority Data

Dec. 14, 1995 [DE] Germany ............... 195 46 782

[51] Int. Cl.⁶ .................. H01B 7/04; H05K 1/02
[52] U.S. Cl. ...................... 174/117 F; 174/261
[58] Field of Search ................. 174/94 R, 117 F, 174/261; 102/301, 311, 312; 439/404, 405, 492, 493; 361/772

[56] References Cited

U.S. PATENT DOCUMENTS

| | | | |
|---|---|---|---|
| 3,794,522 | 2/1974 | Mueller et al. | 174/117 F |
| 4,406,915 | 9/1983 | Lang | 174/117 F |
| 4,770,645 | 9/1988 | Antes | 439/493 X |
| 5,212,348 | 5/1993 | Gibson | 174/117 F |
| 5,363,549 | 11/1994 | Hecker | 29/742 |
| 5,536,909 | 7/1996 | DiStefano et al. | 174/261 |
| 5,571,985 | 11/1996 | Ritter et al. | 102/217 |
| 5,679,929 | 10/1997 | Greenfield et al. | 174/261 |

FOREIGN PATENT DOCUMENTS 4 433 880  9/1994  Germany.

*Primary Examiner*—Kristine Kincaid
*Assistant Examiner*—Chau N. Nguyen
*Attorney, Agent, or Firm*—Foley & Lardner

[57] ABSTRACT

In an electrical circuit arrangement, specifically a sequential blasting system as used in mining, the individual circuit units 12 are contacted by a continuous flat cable 10 in such a way that each wire 16 to 19 of the cable 10 has a bared section 21 which is soldered to a contact pad 22 to 26 of a conductor pattern 15 disposed on a printed circuit board 11 which carries the circuit elements of the circuit unit 12. This not only minimizes the total number of contacts but also prevents the contact points from increasing the line resistance and prevents any faulty contact point from interrupting the line.

6 Claims, 3 Drawing Sheets

CIRCUIT ARRANGEMENT HAVING A PLURALITY OF CIRCUIT UNITS AND A COMMON MULTI-WIRE CABLE

BACKGROUND OF THE INVENTION

In mining, blasting systems are used for sequentially triggering explosive charges placed in bore holes at a working face. Each explosive charge is ignited by an associated trigger stage, and all trigger stages are connected in cascade with a pulse source via a control line. The control line often takes the form of a flat cable usually including four wires; some circuits require only three or even only two wires. Examples for such sequential blasting systems are described in U.S. Pat. No. 5,571,985 and German Patent No. 4,433,880.

The circuit components of each trigger stage are usually assembled on a printed circuit board enclosed in a protective casing. The circuit board is provided with contact points for connecting, by soldering, the incoming control line, the outgoing control line, and branch lines which lead to one or more explosive charges. This results in two soldering points for each individual wire of the control line within the area of each trigger stage, which not only necessitates corresponding expenditure in manufacture but also involves a risk of faulty contacts.

In sequential blasting systems, a single faulty contact may result in only part of the explosive charges being triggered or in explosions being simultaneously initiated at a plurality of locations, depending or the type of circuitry employed and on the location of the fault. In any case, the propagation of the explosion pressure wave, which has been designed by suitably placing of the blasting system, is disturbed and the efficiency of the sequential blasting system is at least substantially reduced. Moreover, an interruption of the control line within the region of its connection to a trigger stage may be caused by tensile stress exerted on the control line, which frequently occurs due to cough handling, particularly in underground mining.

SUMMARY OF THE INVENTION

It is an object of the invention to reduce the risk of line interruptions or faulty contacts in an electrical circuit arrangement which includes a plurality of circuit units connected to a multi-wire cable.

To meet this object, the invention provides an electrical circuit arrangement comprising a plurality of circuit units each including a conductor pattern formed on a printed circuit board, and a multi-wire cable interconnecting all these circuit units and including a plurality of wires, each wire having a portion exposed within the area of each circuit unit and connected to a portion of the respective conductor pattern, at least one of the wires being uninterrupted and connecting all circuit units in parallel.

Those wires of the multi-wire cable which serve for the common supply of all units are continuous for all circuit units. They are stripped of their insulation only over part of their lengths within the region of contact with each circuit unit. If this contact is faulty due to manufacture or becomes interrupted, such as by excessive tensile forces acting on the cable, it is only the respective circuit unit that will fail, while the overall line remains uninterrupted. In the case of a sequential blasting system with appropriately designed electrical circuits, this means that only one single explosive charge or a small number of them are not triggered, whereas the overall blasting system can still fulfil its function.

In an embodiment of the invention, each wire has a bare intermediate section directly contacting a portion of the respective conductor pattern. This results in a minimum total number of contacts.

Wires which are not continuous for all circuit units require only two soldering points. In known sequential blasting systems, this regularly applies to only that one wire which passes a trigger signal from one stage to the next.

According to another embodiment of the invention, contact elements are mounted on the printed circuit board, each contact element having a first end connected to the conductor pattern and a second end forming a knife-edged terminal for penetrating an insulation of the multi-wire cable to contact a respective one of the wires. This is advantageous with respect to manufacture because it requires no specific step for stripping the insulation from portions within the length of the cable. Using this type of contact element, it is preferred that all contact elements disposed on the same printed circuit board are staggered along the direction of the cable, to provide sufficient space for the contact elements even if the wires of the cable are arranged comparatively close to each other.

BRIEF DESCRIPTION OF THE DRAWINGS

Preferred embodiments of the invention will now be explained with reference to the drawings, in which.

DETAILED DESCRIPTION OF PREFERRED EMBODIMENTS

Figure 1:
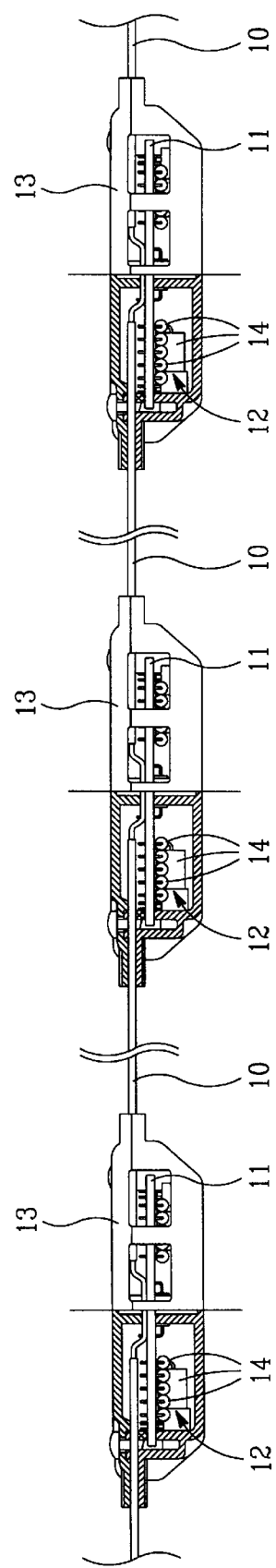
FIG. 1 is a side view, partially in section, of a circuit unit contained within a protective casing and disposed along the length of a control line in the form of a flat cable.
Figure 2:
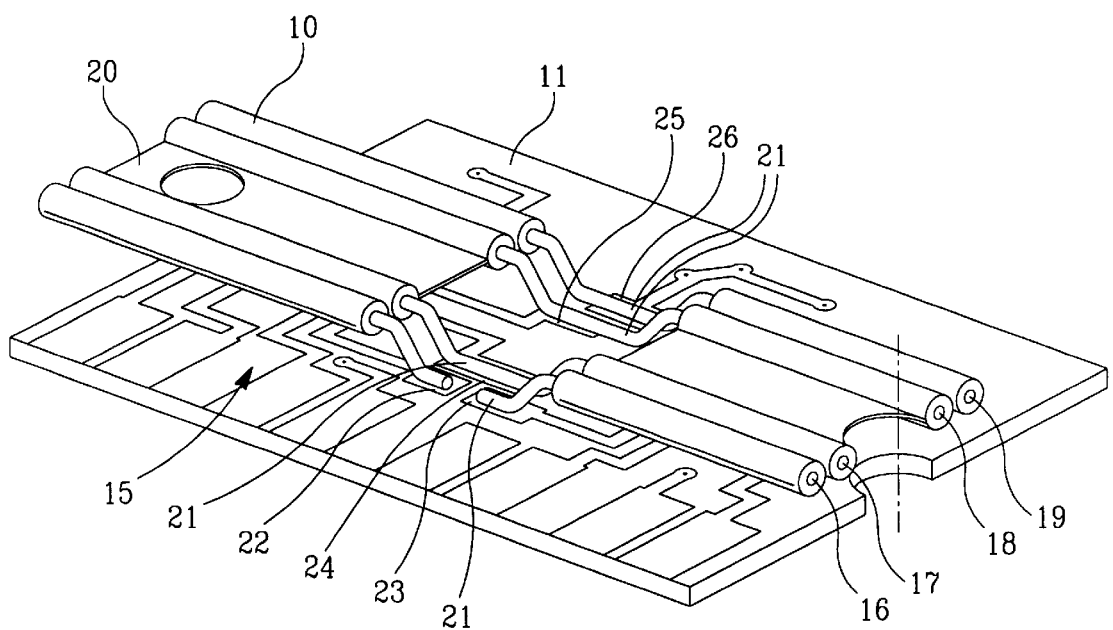
FIG. 2 is a schematic perspective view of the cable of FIG. 1 in the region where it contacts a printed circuit board carrying the components of the circuit unit.

As shown in FIG. 1, a plurality of junctions which are provided along the length of a flat cable 10 and which constitute a plurality of trigger stages for a sequential blasting system, are formed by an electrical circuit unit 12 disposed on a printed circuit board 11 and enclosed in a protective casing 13. In FIG. 1, the various circuit components, indicated at 14, of the circuit unit 12 are disposed on the lower side of the printed circuit board 11 while a conductor pattern 15 which interconnects the circuit components is provided at the upper side of the board 11. In FIG. 2, portions of the conductor pattern 15 are shown schematically.

As illustrated in FIG. 2, the flat cable 10 in the present embodiment has four wires 16 to 19 commonly embedded in an insulating material which defines a centre web 20. Within the region of the printed circuit board 11, all four wires 16 to 19 are stripped of their insulation. The bare sections 21 of the wires are multiply bent to form wire sections which extend parallel to the flat cable 10 but are offset downward therefrom. As shown in FIG. 2, these sections 21 are soldered to contact pads 22 to 26 of the conductor pattern 15.

While the wires 17 to 19 are continuous and connected at their bare sections 21 to respective ones of the contact pads 24 to 26, the wire 16 is interrupted in its bare intermediate section 21, and the two ends thus formed are soldered to separate contact pads 22, 23 of the conductor pattern 15.

In a particularly economic manufacturing method, the wire sections 21 are soldered to the contact pads 22 to 26 in the same step in which the circuit components 14 are soldered to the conductor pattern 15 (provided on the lower side of the printed circuit board 11 and not visible in FIG. 2).

As illustrated in FIG. 2, the conductor wires 17 to 19 are uninterrupted also in the region where they are connected to the circuit units 12 provided on the printed circuit board 11 so that any faulty contact that may exist does not cause an interruption of the wire. For the same reason, the soldering points do not increase the line resistance.

Figure 3A:
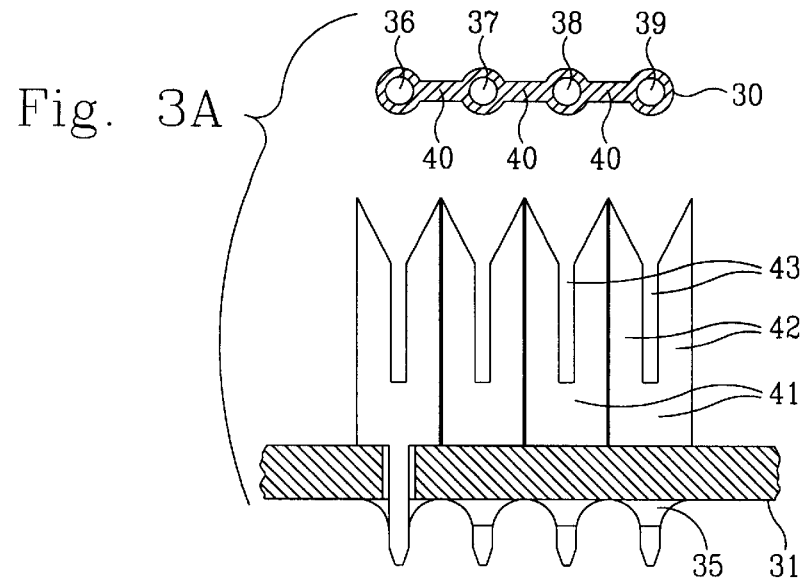
FIGS. 3a to 3c are representations showing another embodiment using contact elements provided on a printed circuit board for connection to the cable.
Figure 3B:
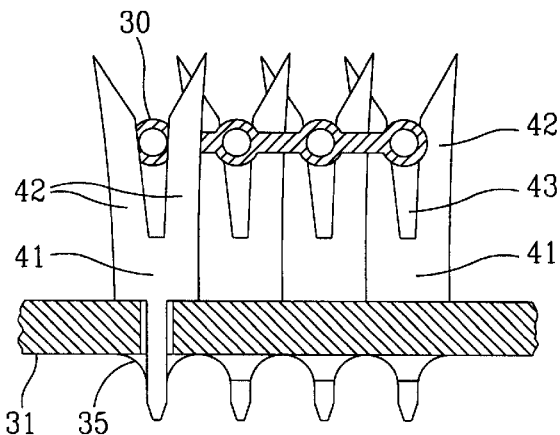
Figure 3C:
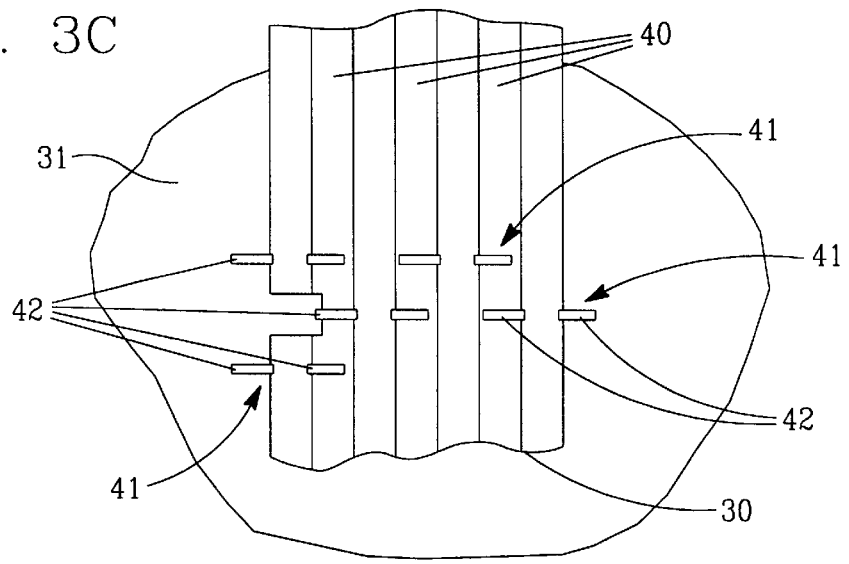

In a second embodiment of the invention shown in FIG. 3, the flat cable 30 is so formed that the insulation forms a web 40 between each pair of adjacent wires 36 to 39. Further, the individual wires 36 to 39 have no section of the insulation stripped off but are inserted in knife-edged terminals 41 which in turn are inserted in the printed circuit board 31 and soldered to the conductor pattern 35 (not shown in detail) which in this case is provided on the lower side of the board 31.

In FIG. 3, (*a*) shows the condition prior to the cable 30 contacting the knife-edged terminals 41, while (*b*) shows the condition after contacting, (*c*) is a plan view of the arrangement shown at (*b*).

As is apparent from FIGS. 3(*a*) and (*b*), the knife-edged terminals 41 are fork-shaped with two upwardly pointed tines 42. The mutually racing edges of the tines 42 are knife-shaped and together form a slot 43 having a width slightly smaller than the diameter of the wires 36 to 39. The tines 42 of each fork are inwardly chamfered so as to penetrate the webs 40 of the flat cable 30 between adjacent wires and lead the respective wire into the slot 43.

According to FIG. 3(*c*), the terminals 41 are staggered in the longitudinal direction of the flat cable 30 to avoid mutual contact between terminals 41 without requiring excessively wide webs 40 in the cable 30.

FIG. 3(*c*) further shows an example in which, similar to FIG. 2, one of the wires, 36, is interrupted within the region of the junction, and either one of the two ends thus formed is contacted by its own knife-edged terminal 41.

Compared to the arrangement of FIG. 2, the embodiment of the invention shown in FIG. 3 has a manufacturing advantage in that it requires neither removing the insulation from any sections of the flat cable nor bending of the bared wire sections. On the other hand, the embodiment of FIG. 2 has the advantage that it requires no additional contact elements (knife-edged terminals) and one single soldering connection contacts the wire directly with the corresponding portion of the conductor pattern.

We claim:

1. An electrical circuit arrangement comprising:

a plurality of circuit units each constituting a trigger stage of a sequential blasting system and including a conductor pattern formed on a printed circuit board, and a multi-wire cable formed as a flat cable interconnecting all of said circuit units and including a plurality of wires, each of said wires having a respective exposed portion proximate to each of said circuit units and connected to the respective conductor pattern, at least one of said wires being uninterrupted and connecting all of said circuit units in parallel.

2. The circuit arrangement of claim 1, wherein each said exposed portion directly contact the respective conductor pattern.

3. The circuit arrangement of claim 1, including contact elements mounted on each of said printed circuit boards, each of said contact elements having a first end connected to said respective conductor pattern and a second end forming a knife-edged terminal for penetrating insulation of said multi-wire cable to contact a respective wire thereof.

4. The circuit arrangement of claim 3, wherein said contact elements disposed on each of the printed circuit boards are staggered along the length of said cable.

5. An electrical circuit arrangement comprising:

a plurality of circuit units each including a conductor pattern formed on a printed circuit board, and a multi-wire cable interconnecting all of said circuit units and including a plurality of wires, each of said wires having a respective exposed portion proximate to each of said circuit units and connected to the respective conductor pattern, at least a first one of said wires being uninterrupted and connecting all of said circuit units in parallel, and at least a second one of the wires being interrupted at a bare intermediate section with both ends thus formed contacting separate portions of said respective conductor pattern.

6. The circuit arrangement of claim 5, wherein each said exposed portion of said first wire directly contacts the respective conductor pattern.

* * * * *